United States Patent [19]

Yamazaki

[11] Patent Number: 4,871,581
[45] Date of Patent: Oct. 3, 1989

[54] CARBON DEPOSITION BY ECR CVD USING A CATALYTIC GAS

[75] Inventor: Shumpei Yamazaki, Tokyo, Japan

[73] Assignee: Semiconductor Energy Laboratory Co., Ltd., Atsugi, Japan

[21] Appl. No.: 216,333

[22] Filed: Jul. 8, 1988

[30] Foreign Application Priority Data

Jul. 13, 1987 [JP] Japan ............... 62-175559

[51] Int. Cl.⁴ ............................................. B05D 3/14
[52] U.S. Cl. ....................................... 427/39; 427/47; 427/38; 427/122; 423/446; 118/723
[58] Field of Search ............... 427/38, 39, 249, 255.1, 427/255.2, 47, 122; 423/446; 118/715, 723

[56] References Cited

U.S. PATENT DOCUMENTS 4,434,188  2/1984  Kamo et al. ............... 423/446

FOREIGN PATENT DOCUMENTS

| 59-18197 | 1/1984 | Japan . |
| 60-103099 | 6/1985 | Japan . |
| 61-36200 | 2/1986 | Japan . |
| 61-132507 | 6/1986 | Japan . |
| 61-151095 | 7/1986 | Japan . |
| 61-266618 | 11/1986 | Japan . |
| 62-96397 | 5/1987 | Japan . |

Primary Examiner—Shrive Beck
Assistant Examiner—Roy V. King
Attorney, Agent, or Firm—Gerald J. Ferguson, Jr.

[57] ABSTRACT

A material consisting mainly of carbon can be formed on a surface by virtue of a microwave energy. A catalyst gas is introduced into a reaction chamber for ECR CVD, along with a carbon compound gas. The catalyst gas consists of a gaseous compound of germanium such as $GeH_4$ and $GeF_4$.

8 Claims, 3 Drawing Sheets

CARBON DEPOSITION BY ECR CVD USING A CATALYTIC GAS

BACKGROUND OF THE INVENTION

This invention relates to a carbon deposition method, and more particularly, relates to a microwave enhanced CVD method for performing carbon deposition such as diamond.

Recently, ECR (Electric Cyclotron Resonance) CVD has attracted the interest of researchers as a new method of manufacturing thin films, particularly amorphous thin films. For example, Matsuo et al discloses one type of such as ECR CVD apparatus in U.S. Pat. No. 4,401,054. This recent techinique utilizes microwave energy to energize a reactive gas such that it develops into a plasma. A magnetic field functions to pinch the plasma gas within the excitation space. Within this excitation space, the reactive gas can absorb the energy of microwaves. A substrate to be coated is located distant from the excitation space (resonating space) for preventing the same from being spattered. The energized gas is showered onto the substrate from the resonating space. In order to establish electron cyclotron resonance, the pressure in a resonating spaces is kept at $1 \times 10^{-5}$ Torr at which pressure electrons can be considered as independent particles and resonate with the microwave energy in an electron cyclotron resonance on a certain surface on which the magnetic field strength meets the requirement for ECR. The excited plasma is extrated from the resonating space, by means of a divergent magnetic field, and is conducted to a deposition space which is located distant from the resonating space and in which there is disposed a substrate to be coated.

In such a prior art method, it is very difficult to perform carbon deposition of a polycrystalline or single-crystalline structure, so that currently available methods are substantially limited to processes for manufacturing amorphous films. Also, high energy chemical vapor reaction can not readily be accomplished by such a prior art and therefore it has not been possible to form diamond films or other films having high melting points, or uniform films on a surface having depressions and caves can not be formed. Furtheremore, it was impossible to coat the surface of a super hard metal such as tungsten carbide with a carbon film. Because of this it is necessary to coat a super hard surface with a fine powder of diamond for use of abrasive which has a sufficient hardness and to make sturdy mechanical contact between the diamond powder and the substrate surface.

SUMMARY OF THE INVENTION

It is therefore an object of the invention to provide a microwave enhanced CVD method for depositing a carbon.

According to one aspect of the invention, in addition to a carbon compound gas, nickel, manganese or germanium compound gas is introduced into the reaction chamber. The added compound functions as a catalyst. The reactive gas is excited to be a high density plasma at a pressure of 0.001–760 Torr, preferably 10–100 Torr by virtue of the catalyst. Then, the excited condition of the carbon compound gas is maintained for a substantial time while making contact with reduced nickel, manganese or germanium elements which are produced by decomposition of the catalyst compound, and therefore resulting in high speed deposition of diamond grains or carbon films containing diamond grains. "Reduced" nickel is such that there is few oxygen atoms therein. For example, it can be obtained in accordance with the following equations by exposing nickel powder to high temperature hydrogen gas or hydrogen plasma.

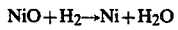

or

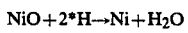

By disposing an object to be coated in the mixed cyclotron resonance space or a space distant therefrom being in an excited condition, the product can be deposited on the object. To this end, the object is located in a position where the strength of the electric field of microwave energy takes its maximum value or in the vicinity to that position. A reactive gas is introduced to the resonance space which is maintained at a relatively high pressure between 0.001 Torr and 760 Torr, preferably between 10 Torr and 100 Torr. Then, a high density plasma is established which density is $10^2$ to $10^5$ times as high as that conventionally established. In the light of such a high density, it becomes possible for the first time to decompose carbon compounds and to perform carbon deposition containing carbon as its main component, e.g. diamond deposition or i-carbon (composite comprising diamond or microcrystalline grains) deposition. In the case of deposition on a surface having indentations, depressions and caves, diamond has a tendency to be deposited preferentially on the corner.

A gaseous catalyst is introduced simultaneously or after the introduction of the carbon compound gas. The catalyst functions as a homogeneous catalyst which is effective to flying carbon compounds. In case of reduced nickel, manganese or germanium in the form of cores or seeds on the film formation surface, it can be function as "non-homogeneous" catalyst so that the carbon compounds make contact with the catalyst on the surface and the excited condition can be maintained for a substantial time period.

The formation mechanism of carbon depositions is such that the carbon compounds make contact, under a plasma-excited atmosphere, with the seeds of the catalyst which have been formed on the surface to be coated, resulting in crystal(s) grown around those seeds. During the development of the crystalline carbon on the surface, relatively low density portions, e.g. amorphous portions, are removed by etching with plasma hydrogen or plasma oxygen, preferentially leaving relatively high density portions, e.g. crystals.

By virtue of this process in which a low dilution of hydrogen can be available, diamond deposition can be performed at a speed 5–20 times as faster as those available in prior arts. For this reason, the production coast per grams in on the order 100 times as expensive as those of high-pressure press methods, while the production cost of vapor phase methods is on the order 1000 times as expensive as those of high-pressure press methods. Furthermore, uniform and even films of diamonds becomes available for the first time by this invention which is promising new applications.

According to another aspect of the invention, a new CVD process is proposed which utilizes a mixed cyclotrom resonance. In the improved exciting process, sonic action of the reactive gas itself must be taken into consideration as a non-negligible perturbation besides the interaction between respective particles of the reactive gas and the magnetic field and microwave, and as a result charged particles of a reactive gas can be energized in a relatively wide resonating space. Preferably, the pressure is maintained higher than 3 Torr. For the mixed resonance, the pressure in a reaction chamber is elevated $10^2$-$10^5$ times as high as that of the prior art. For example, the mixed resonance can be established by increasing the pressure after ECR takes place at a low pressure. Namely, first a plasma gas is placed in ECR condition at $1\times10^{-3}$ to $1\times10^{-5}$ Torr by inputting microwaves under the existence of magnetic field. Then a reactive gas is inputted into the plasma gas so that the pressure is elevated to 0.1 to 300 Torr and the resonance is changed from ECR to MCR (Mixed Resonance).

DETAILED DESCRIPTION OF THE PREFERRED EMBODIMENTS

Figure 1:
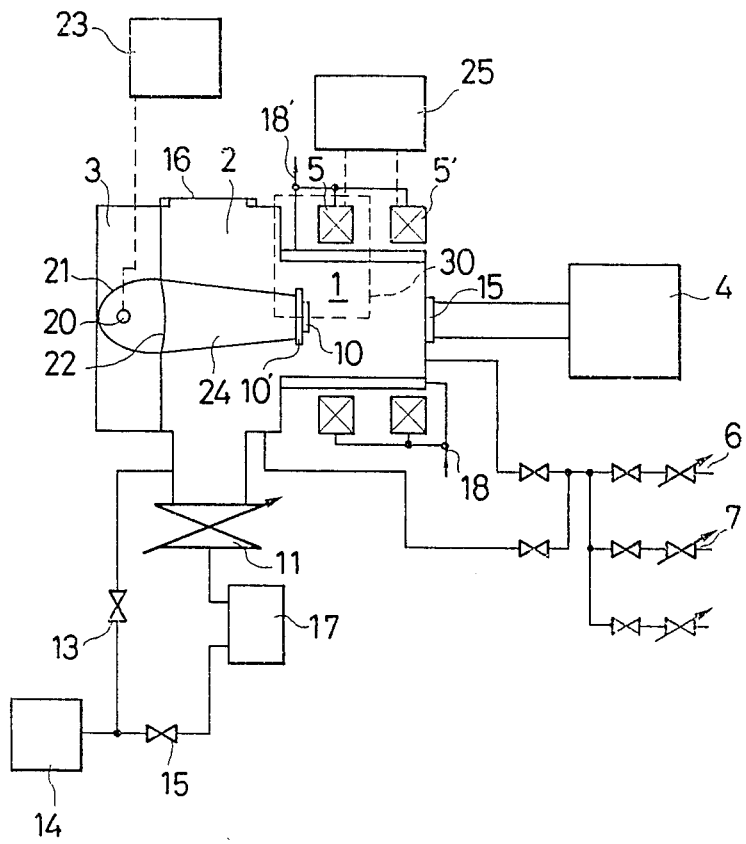
FIG. 1 is a cross section view showing a CVD apparatus in accordance with the present invention.

Referring to FIG. 1, an examplary microwave enhanced plasma CVD appratus in accordance with the present invention is illustrated. As shown in the figure, the apparatus comprises a reaction chamber in which a plasma generating space 1 and an auxiliary space 2 are defined which can be maintained at an appropriate negative pressure, a microwave genarator 4, elecrto-magnets 5 and 5' in the from of Helmholtz coils surrounding the space 1, a power supply 25 for supplying an electric power to the electro-magnets 5 and 5', and a water cooling system 18.

The plasma generating space 1 has a circular cross section, and within the plasma generating space, there is provided a substrate holder 10', made of a material which provokes minimun disturbance of magnetic field created by the magnets 5 and 5' in the chamber, e.g., made of stainless steel or quartz. A substrate 10 is mounted on the holder 10'. The substrate holder 10' is irradiated and heated to 800°-1000° C. in the atmosphere of a high temperature plasma gas by means of an infrared radiation 24, which is emitted from an IR heater 20, reflected from an IR reflection parabolic mirror 21 and focused on the back surface of the holder 10' through a lens 22. Reference numeral 23 designates a power supply for the IR heater 20. Provided for evacuating the reaction chamber is an evacuating system comprising a turbo molecular pump 17 and a rotary pump 14 which are connected with the reaction chamber through pressure controlling valves 11, 13 and 15. The substrate temperature may reach a sufficient level solely by virtue of the plasma gas generated in the reaction chamber and, in the case, the heater can be dispensed with. Further, depending on the condition of the plasma, the substrate temperature might become too high to enable a suitable reaction to occur, in which case cooling means for the substrate has to be provided.

In use of the above described apparatus, a substrate 10 is mounted on a substrate holder 10', and the reaction chamber is evacuated to $1\times10^{-6}$ Torr or a higher vacuum condition. Then, hydrogen gas is introduced from a gas introducing system 6 at 300 SCCM, and microwave energy at a power level of 1 kilo Watts and a frequency of 2.45 GHz is injected from the microwave generator through a microwave introduction window 15 into the plasma generating space 1 which is subjected at the same time to a magnetic field of about 2 K Gauss generated by the magnets 5 and 5'. The magnets are adapted to adjust the magnetic field strength. The hydrogen is excited into a high density plasma state in the space 1. The surface of the substrate 10 is cleaned by high energy electrons and hydrogen atoms. In addition to the introduction of hydrogen gas, a productive gas comprising a carbon compound such as $C_2H_2$, $C_2H_4$, $C_2H_6$, $CH_3OH$, $C_2H_5OH$ or $CH_4$ for example is inputted at 30SCCM through a gas introduction system 7. In this process, the productive gas is diluted with hydrogen at a sufficiently low density, e.g., 1 to 5%. Further, $Ni(CO)_4$ at 1 SCCM (and $GeH_4$ at 2 SCCM in addition, if necessary) as a catalyst is inputted to the reaction chamber from the introduction system, the proportion of the catalyst to the carbon compound gas being 0.1% to 10%. NiF, NiO, $NiF(H_2O)n$ (where n=1.3), $Ni(CN)_2$, $Ni(C_5H_5)_2$, $GeH_4$, $GeF_4$, manganese carbonyl, $MnF_2$ and the like are examples of catalysts in accordance with the present invention. They can be used respectively alone or combinations. The CVD reaction which occurs results from carbon atoms being excited to a high energy condition and heated to 800°-1000° C. by virtue of the plasma gas and the heater 20 so that the substrate 10 mounted on the substrate holder 10' is coated with carbon in the form of a 0.1-100 microns thick film of i-carbon (insulated carbon consisting of microcrystals) or diamond having a grain diameter of from 0.1 to 100 microns. In accordance with experimental, tests, it took only two hours to deposit a carbon film having an average thickness of 5 microns. The deposition speed can be increased by applying a bias voltage to the substrate holder. The carbon product in accordance with the present invention is characterized in that at least 50% of carbon atoms have been connected by $sp^3$ bonds.

For reference, a film formation process was performed in the same manner as in the above but without using a catalyst. As a result, it took 15 hours to form a carbon film having an average thickness of 4 microns. It was confirmed by a metal microscope (1000 times magnification) that the unevenness of the surface of the film was significant. In accordance with the present invention, since innumerable seeds of catalyst prevail over the surface to be coated, carbon films can be formed with flat surfaces.

Next, a second embodiment of the present invention will be described. In this embodiment, a gaseous catalyst and hydrogen are introduced to the reaction chamber in advance of the introduction of a carbon compound gas in order to form innumerable clusters of reduced nickel or germanium which function as seeds on a surface to be coated. After that, a carbon compound gas and hydrogen are introduced to initiate carbon deposition. In accordance with experiments, the carbon films could be formed with smooth surfaces. In this process, however, since the catalyst does not make contact with the gaseous carbon compound being excited by plasma gas, the deposition speed is improved only by 20% to 30% in comparison with those available in prior arts. The reason why the improvement of the deposition speed is so limited as compared with the previous embodiment is that the catalyst is covered with carbon and prevented from further contacting the carbon compound.

Figure 2A:
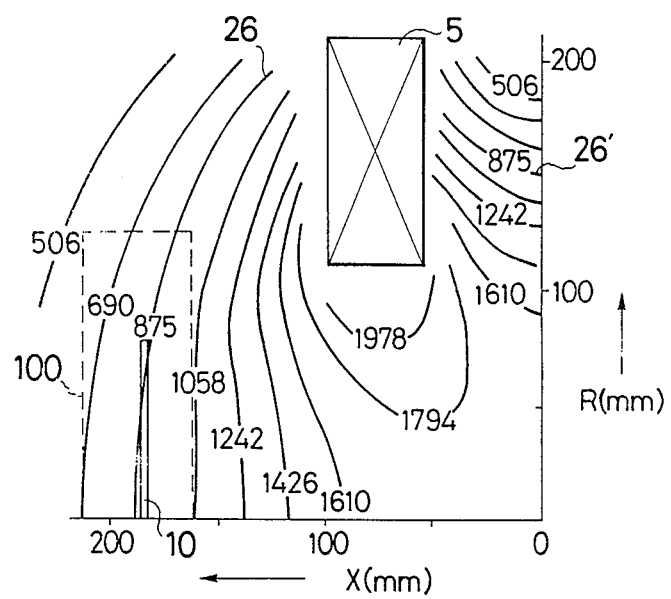
FIG. 2(A) is a graphical diagram showing a computor simulation of the profiles of the equipotential surfaces of magnetic field in a cross section.
Figure 2B:
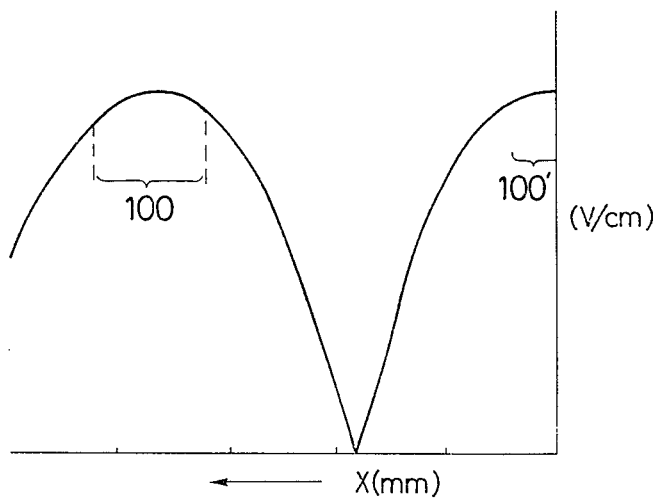
Figure 3A:
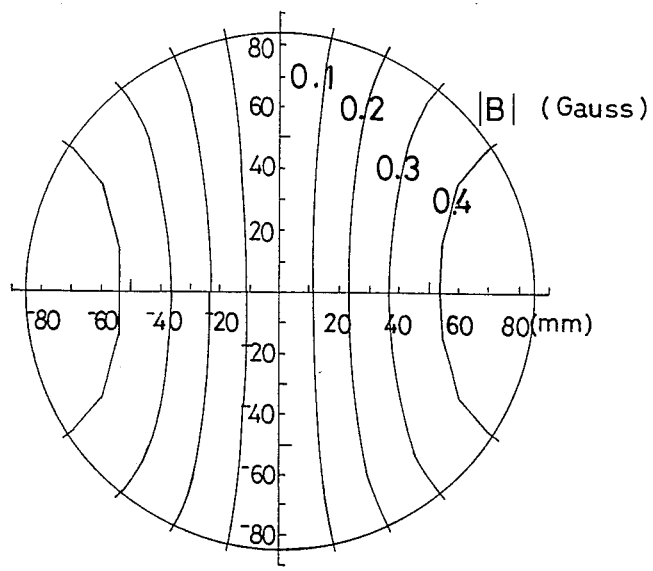
FIGS. 3(A) and 3 (B) are graphical diagrams showing equipotential surfaces respectively in terms of magnetic field and electric fields of microwave energy propagating in a resonating space.
Figure 3B:
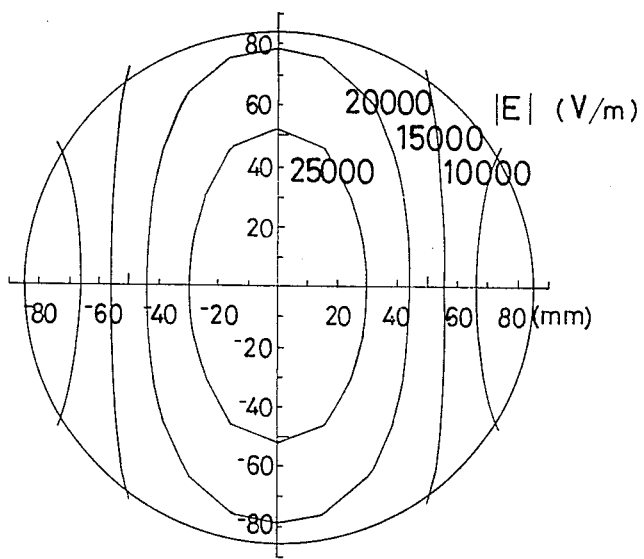

FIG. 2(A) is a graphical showing of the distribution of the magnetic field in the region 30 in FIG. 1. The curves in the diagram are plotted along equipotential surface and are given numerals indicating the strengths along the respective curves of the magnetic field induced by magnets 5 and 5' having a power of 2000 Gauss. By adjusting the power of the magnets 5 and 5', the strength of the magnetic field can be controlled so that the magnetic field becomes largely uniform over the surface to be coated which is located in the region 100 where the magnetic field (875±185 Gauss) and the electric field interact. In the diagram, the reference 26 designates the equipotential surface of 875 Gauss at which the conditions required for ECR (electron cyclotron resonance) between the magnetic field and the microwave frequency are satisfied. Of course, in accordance with the present invention, ECR can not be established due to the high pressure in the reaction chamber, but instead a mixed cyclotron resonance takes place in a broad region including the equipotential surface which satisfied ECR conditions. FIG. 2(B) is a graphical diagram in which the X-axis corresponds to that of FIG. 2(A) and which shows the strength of the electric field of the microwave energy in the plasma generating space 1. As shown, the electric field strength takes its maximum value in the regions 100 and 100', it is difficult to heat the substrate 10' without disturbing the propagation of the microwave energy. In other regions, a film will not be uniformly deposited, but will be deposited in the form of a doughnut. It is for this reason that the substrate 10 is disposed in the region 100. The plasma flows in the lateral direction. According to experiments, a uniform film can be formed on a circular substrate having a diameter of up to 100 mm, and a film can be formed in the chamber on a circular substrate having a diameter of up to 50 mm with a uniform thickness and a uniform quality. When a larger substrate is desired to be coated, the diameter of the space is double with respect to the vertical direction of FIG. 2(A) by making use of 1.225 GHz as the frequency of the microwave energy. FIG. 3(A) and FIG. 3(B) are graphical diagram showing the distribution of the magnetic field and the electric field due to microwave energy emitted from the microwave generator 4 for a cross section of the plasma generating space 1. The curves in the circles of the figures are plotted along equipotential surfaces and given numerals showing the field strengths. As shown in FIG. 3(B), the electric field reaches its maximum value at 25 KV/m.

In accordance with the present invention, carbon films or clusters can be formed. The effect of the invention has been confirmed in regard to carbon deposition, and therefore it is advantageous to apply the present invention to the formation of any films containing carbon whose proportion is not lower than 50%.

While a description has been made for several embodiments, the present invention should be limited only by the appended claims and should not be limited by the particular examples, and there may be caused to artisan some modifications and variation according to the invention. For example, it has been proved effective to add boron, nitrogen, phosphorus or the like into the carbon. This invention is applicable to other types of CVD methods such that a plurality of substrates have been arranged in parallel with each other and parallel with the propagating direction of the microwave, and in this case a 13.56 MHz electric power is supplied to the reaction chamber in which there are disposed the substrates given a bias voltage of 50 KHz.

I claim:

1. A method of depositing a material consisting mainly of carbon comprising the steps of:

placing an object for deposition in a reaction chamber;

introducing a carbon compound gas into said reaction chamber; and inputting a power to said reaction chamber in order to decompose said carbon compound gas and deposit the carbon product of the decomposition on the surface of said object, wherein a catalytic gas is introduced into said reaction chamber in order to expedite the deposition of said carbon product, said catalytic gas being the halide or the hydride of germanium.

2. The method of claim 1, wherein said input power is microwave power.

3. The method of claim 2, wherein the frequency of said microwave is not lower than 500 MHz.

4. The method of claim 3, wherein said carbon compound gas is diluted with hydrogen or a gaseous oxide or is introduced together with hydrogen or a gaseous oxide.

5. The method of claim 4, wherein said catalytic gas is diluted with hydrogen or a gaseous oxide or is introduced together with hydrogen or a gaseous oxide.

6. The method of claim 5, wherein said reaction chamber is subjected to a magnetic field substantially in the propagating direction of said microwave energy.

7. The method of claim 1, wherein said carbon product is deposited to form a non-fibrous, non-filamentary diamond coating on said object.

8. A method of depositing a material consisting mainly of carbon comprising the steps of:

placing an object for deposition in a reaction chamber;

introducing a carbon compound gas into said reaction chamber; and inputting a power to said reaction chamber in order to decompose said carbon compound gas and deposit the carbon product of the decomposition on the surface of said object, wherein a catalytic gas is introduced into said reaction chamber in order to expedite the deposition of said carbon product, said input power is microwave power with the frquency of said microwave not being lower than 500 MHz; said carbon compound gas is diluted with hydrogen or a gaseous oxide or is introduced together with hydrogen or a gaseous oxide, said catalytic gas is diluted with hydrogen or a gaseous oxide or is introduced together with hydrogen or a gaseous oxide, and said catalytic gas is the halide or the hydride of germanium.

* * * * *